US012097816B2

United States Patent
Kobayashi et al.

(10) Patent No.: US 12,097,816 B2
(45) Date of Patent: Sep. 24, 2024

(54) ELECTRICAL CONNECTION BOX

(71) Applicant: Yazaki Corporation, Tokyo (JP)

(72) Inventors: Kazuki Kobayashi, Shizuoka (JP);
Kohei Toyoshima, Shizuoka (JP);
Kenji Segawa, Shizuoka (JP);
Masahiro Fujiwara, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 331 days.

(21) Appl. No.: 17/696,895

(22) Filed: Mar. 17, 2022

(65) Prior Publication Data

US 2022/0297620 A1   Sep. 22, 2022

(30) Foreign Application Priority Data

Mar. 18, 2021   (JP) .................................. 2021-044208

(51) Int. Cl.
| | | |
|---|---|---|
| H01R 12/00 | (2006.01) | |
| B60R 16/023 | (2006.01) | |
| H01R 25/14 | (2006.01) | |
| H05K 7/02 | (2006.01) | |

(52) U.S. Cl.
CPC ......... *B60R 16/0238* (2013.01); *H01R 25/14* (2013.01); *H05K 7/026* (2013.01)

(58) Field of Classification Search
CPC . B60R 16/0238; B60R 16/0239; B60R 16/02; H01R 25/14; H05K 7/026; H02G 3/086; H02G 3/081; H02G 3/16
See application file for complete search history.

(56) References Cited

U.S. PATENT DOCUMENTS

| | | | | |
|---|---|---|---|---|
| 2008/0119066 A1* | 5/2008 | Shimizu | ................ | H01R 9/226 439/76.1 |
| 2011/0005826 A1* | 1/2011 | Hashikura | .......... | H05K 7/20854 174/547 |
| 2015/0303669 A1* | 10/2015 | Maebashi | ............ | H05K 5/0052 174/68.2 |
| 2015/0359112 A1* | 12/2015 | Nakashima | ............ | H05K 7/026 174/560 |
| 2016/0156162 A1 | 6/2016 | Yamaguchi et al. | | |
| 2016/0242303 A1* | 8/2016 | Maebashi | ........... | B60R 16/0238 |

(Continued)

FOREIGN PATENT DOCUMENTS

| | | |
|---|---|---|
| JP | 2016-103927 A | 6/2016 |
| JP | 2019-68631 A | 4/2019 |
| JP | 6935293 B2 | 9/2021 |

*Primary Examiner* — Abdullah A Riyami
*Assistant Examiner* — Nelson R. Burgos-Guntin
(74) *Attorney, Agent, or Firm* — KENEALY VAIDYA LLP

(57) ABSTRACT

An electrical connection box includes an insulating connection box housing and an insulating branch box housing. The insulating connection box housing stores a conductive connection box bus bar therein, and the insulating branch box housing stores a conductive branch box bus bar therein. The branch box housing and the connection box housing are stacked in a vertical direction. The connection box bus bar and the branch box bus bar are electrically connected by bringing connection box bus bar tip portions of the connection box bus bar into direct contact with branch box bus bar tip portions of the branch box bus bar and by jointly fastening the tip portions using bus bar fastening members.

6 Claims, 8 Drawing Sheets

(56) References Cited

U.S. PATENT DOCUMENTS

| | | | | |
|---|---|---|---|---|
| 2016/0345455 A1* | 11/2016 | Maebashi | ............ | B60R 16/0238 |
| 2017/0341607 A1* | 11/2017 | Sumida | ................... | B60L 58/26 |
| 2017/0359093 A1* | 12/2017 | Ikeda | ..................... | H04B 1/082 |
| 2018/0263128 A1* | 9/2018 | Nakano | ..................... | H02G 3/16 |
| 2019/0229439 A1* | 7/2019 | Matsuura | ................. | H01R 4/18 |
| 2019/0319434 A1* | 10/2019 | Matsuura | ............ | H01H 85/2015 |
| 2020/0212606 A1* | 7/2020 | Kanamori | ................ | H01R 9/16 |
| 2020/0358274 A1* | 11/2020 | Goto | ..................... | H02G 3/085 |

\* cited by examiner

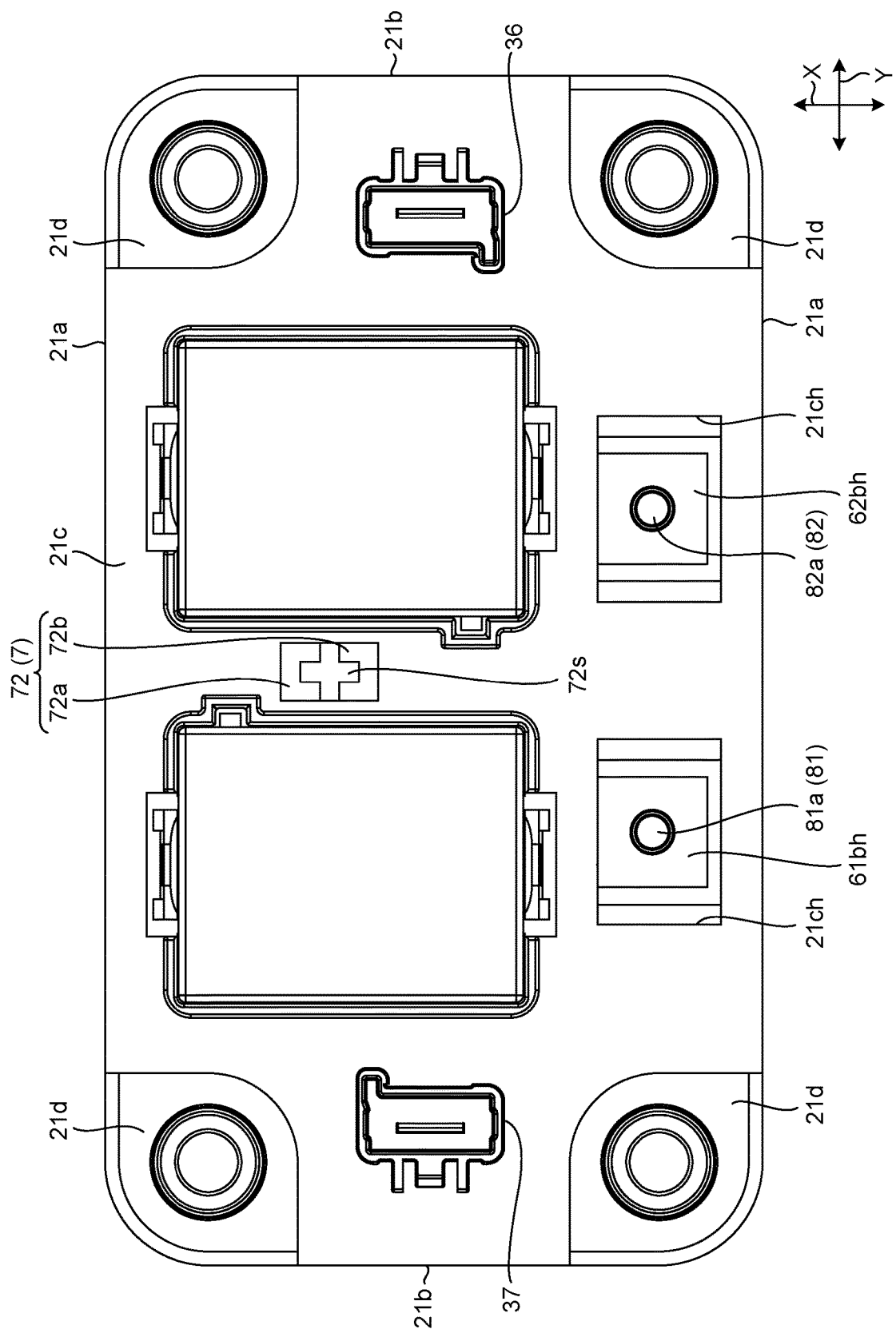

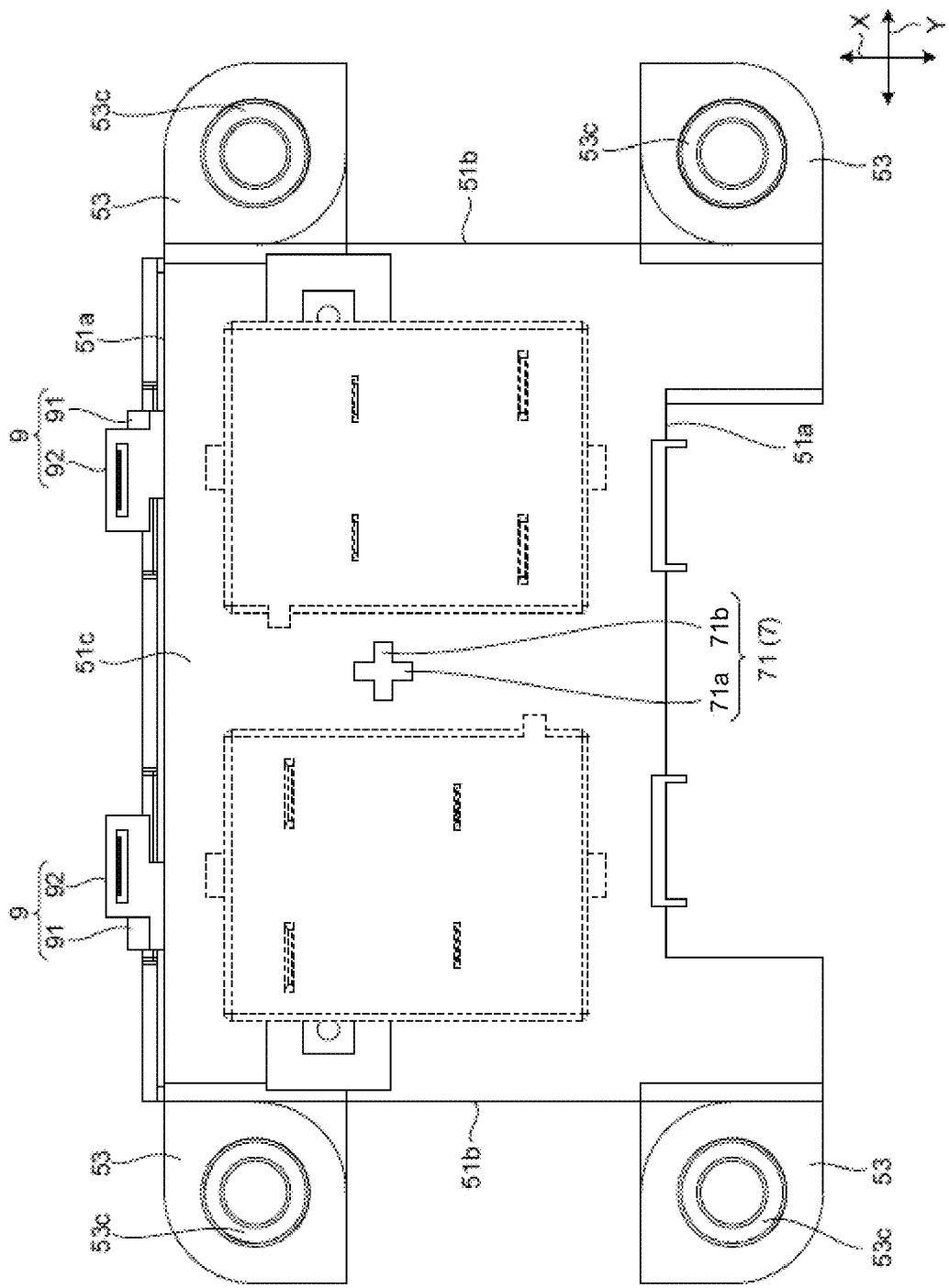

ELECTRICAL CONNECTION BOX

CROSS-REFERENCE TO RELATED APPLICATION(S)

The present application claims priority to and incorporates by reference the entire contents of Japanese Patent Application No. 2021-044208 filed in Japan on Mar. 18, 2021.

BACKGROUND OF THE INVENTION

1. Field of the Invention

The present invention relates to an electrical connection box.

2. Description of the Related Art

Some electrical connection boxes include a first bus bar located in the upper side in the vertical direction, a second bus bar located in the lower side in the vertical direction, and an electronic component (fusible link) that electrically connects the first bus bar and the second bus bar (see, e.g., Japanese Patent Application Laid-open No. 2016-103927).

Further, some electrical connection boxes are provided with a connection box housing that stores a connection box bus bar therein and a storing box housing (branch box housing) that stores a branch box bus bar therein.

In the electrical connection box described above, in the case where the connection box housing and the branch box housing are stacked in the vertical direction and the connection box bus bar and the storing box bus bar are electrically connected by an electronic component, works for the connection are time-consuming as described below. In other words, the electrical connection between the connection box bus bar and the electronic component and then between the storing box bus bar and the electronic component allows the connection box bus bar and the storing box bus bar to be electrically connected through the electronic component. Thus, in the electrical connection box described above, there is room to improve the facilitation of the electrical connection work of the bus bars.

SUMMARY OF THE INVENTION

The present invention is made in view of the circumstances described above and provides an electrical connection box having two bus bars, which is capable of facilitating an electrical connection work between one bus bar and the other bus bar.

To achieve the above object, an electrical connection box according to one aspect of the present invention includes a connection box housing having an insulation property configured to store a connection box bus bar having conductivity inside the connection box housing; and a branch box housing having an insulation property configured to store a branch box bus bar having conductivity inside the branch box housing; wherein the branch box housing and the connection box housing are stacked in a vertical direction, and the connection box bus bar and the branch box bus bar are electrically connected by bringing a connection box bus bar tip portion of the connection box bus bar into direct contact with a branch box bus bar tip portion of the branch box bus bar and by jointly fastening the tip portions using a bus bar fastening member in a state in which the connection box bus bar tip portion is in direct contact with the branch box bus bar tip portion.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 7 is a plan view of the connection box housing of the electrical connection box according to the present embodiment; and FIG. 8 is a bottom view of the branch box housing of the electrical connection box according to the present embodiment.

DETAILED DESCRIPTION OF THE PREFERRED EMBODIMENTS

Embodiments of an electrical connection box according to the present invention are now described with reference to the drawings. Note that the present invention is not limited to the embodiments. In addition, the constitutional components in the following embodiments include those easily conceivable by those skilled in the art or substantially the same.

Figure 1:
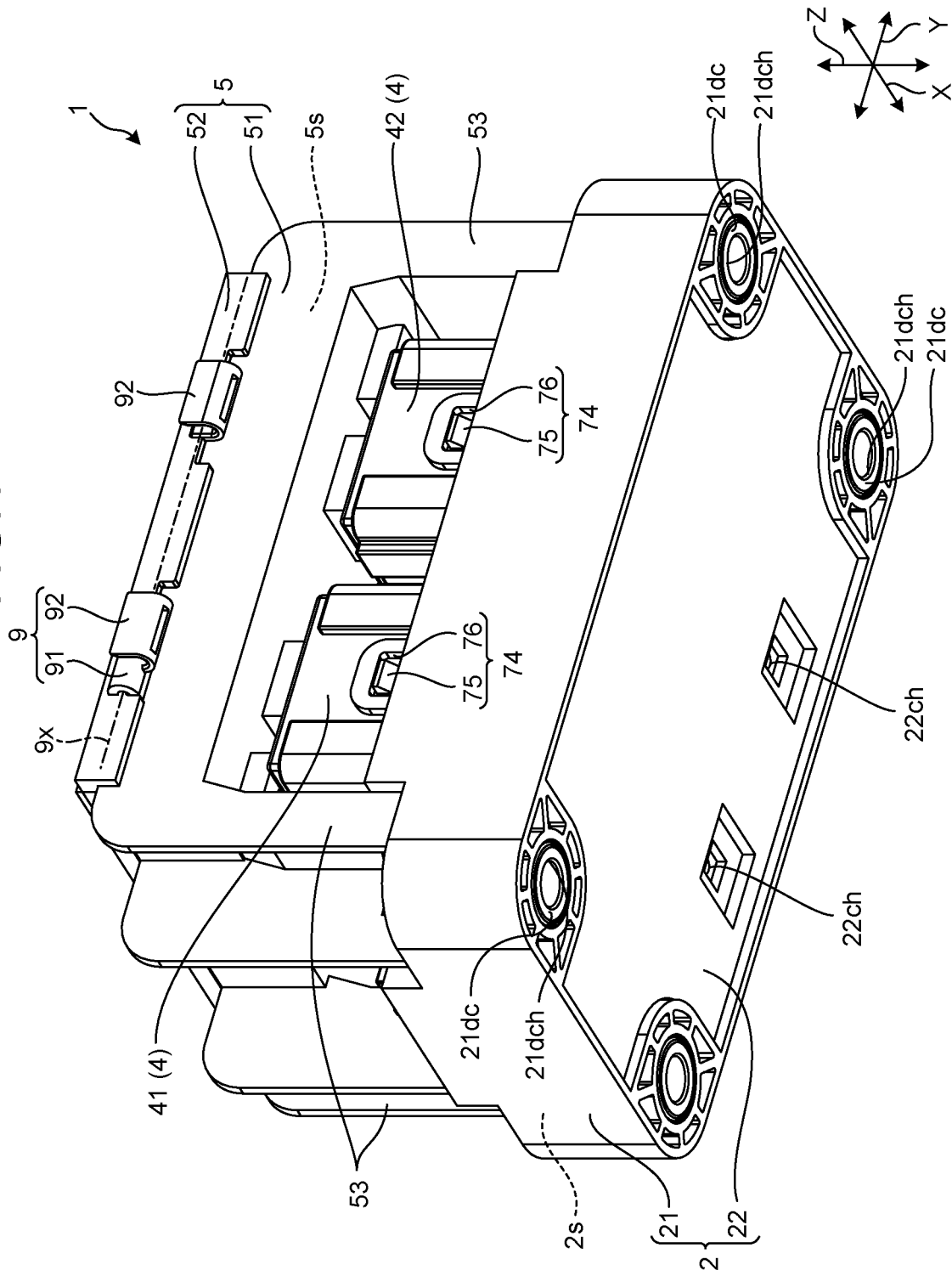
FIG. 1 is a perspective view of an electrical connection box according to the present embodiment.
Figure 2:
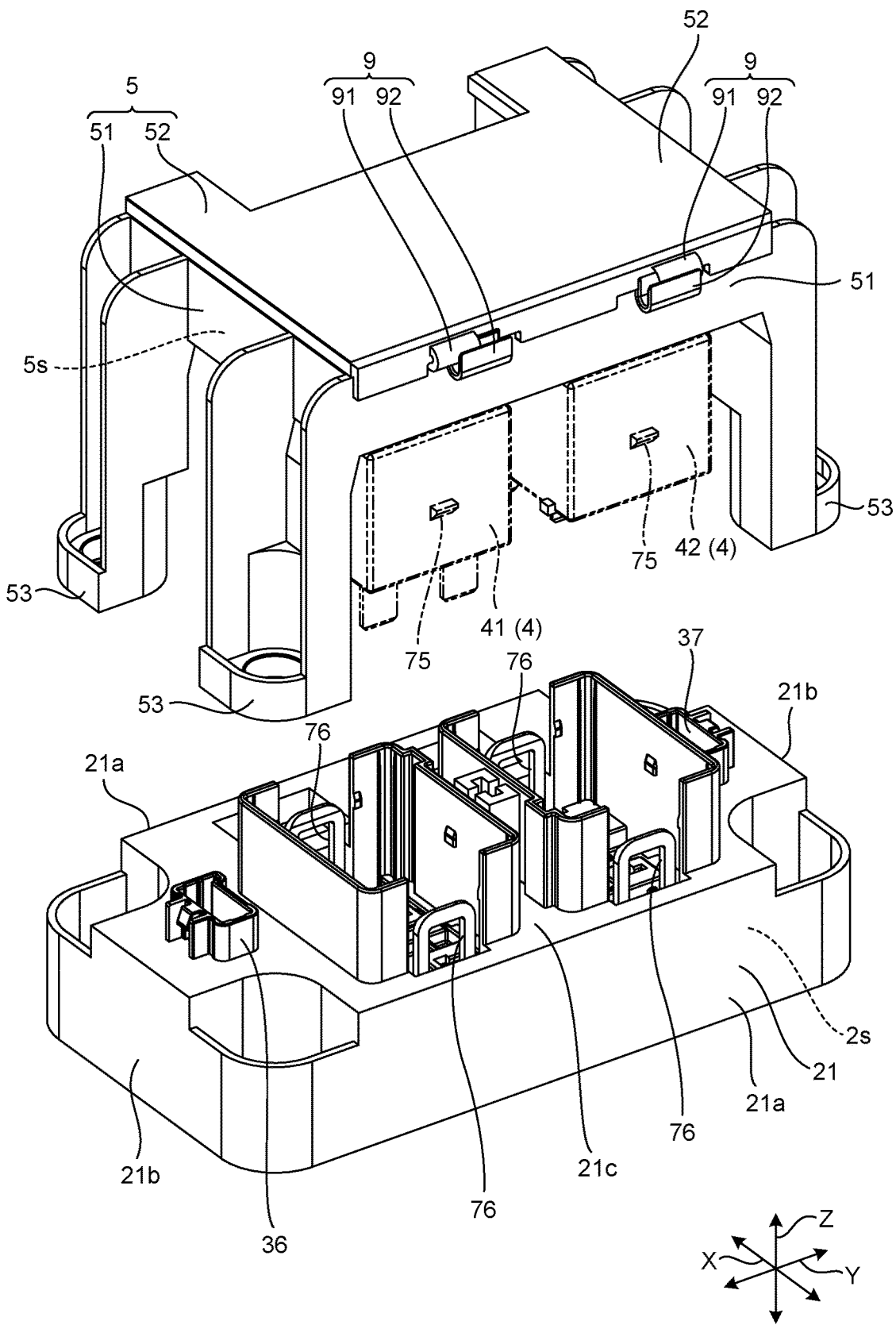
FIG. 2 is an exploded perspective view of the electrical connection box according to the present embodiment.
Figure 3:
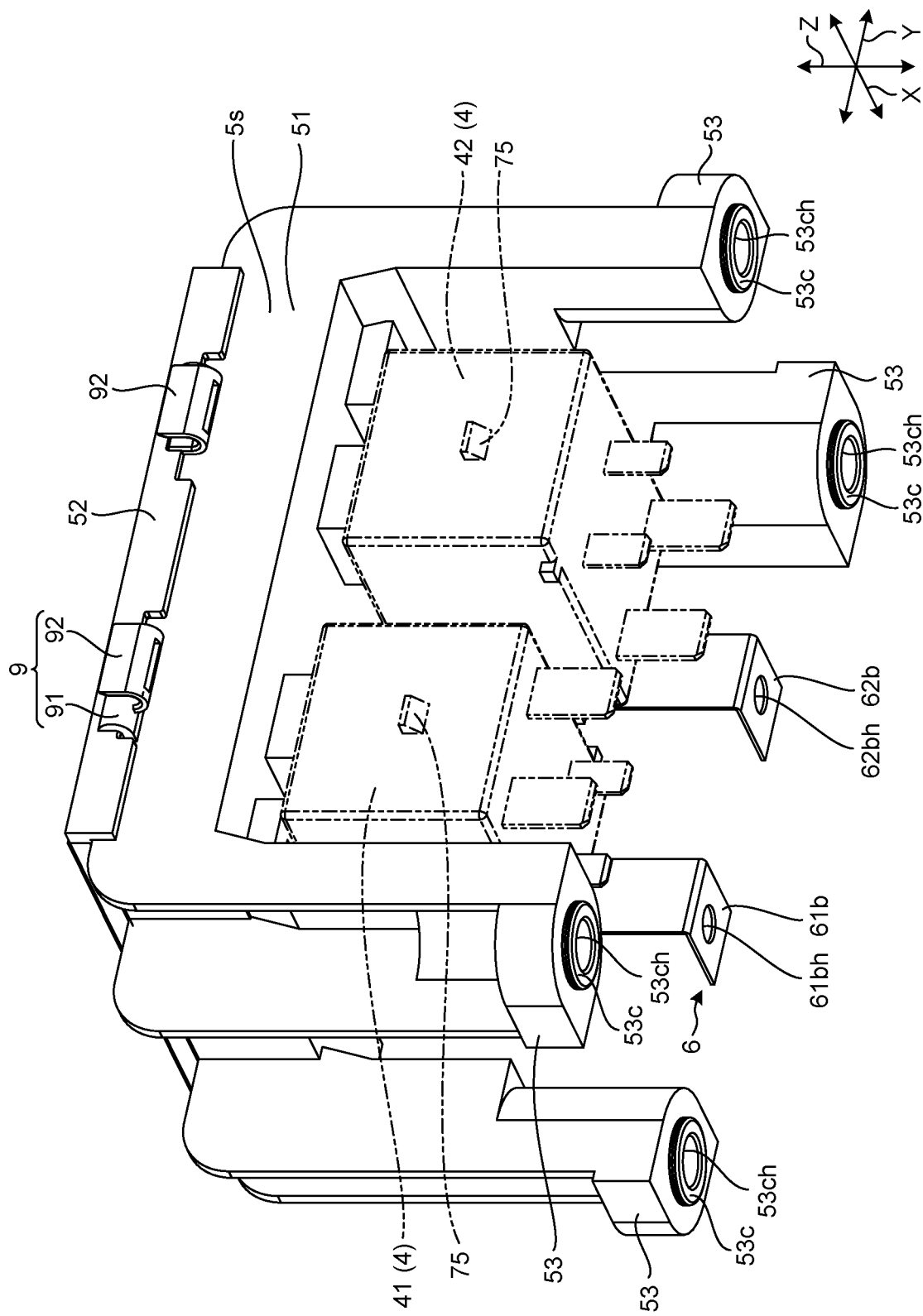
FIG. 3 is a perspective view of a branch box housing included in the electrical connection box according to the present embodiment.
Figure 4:
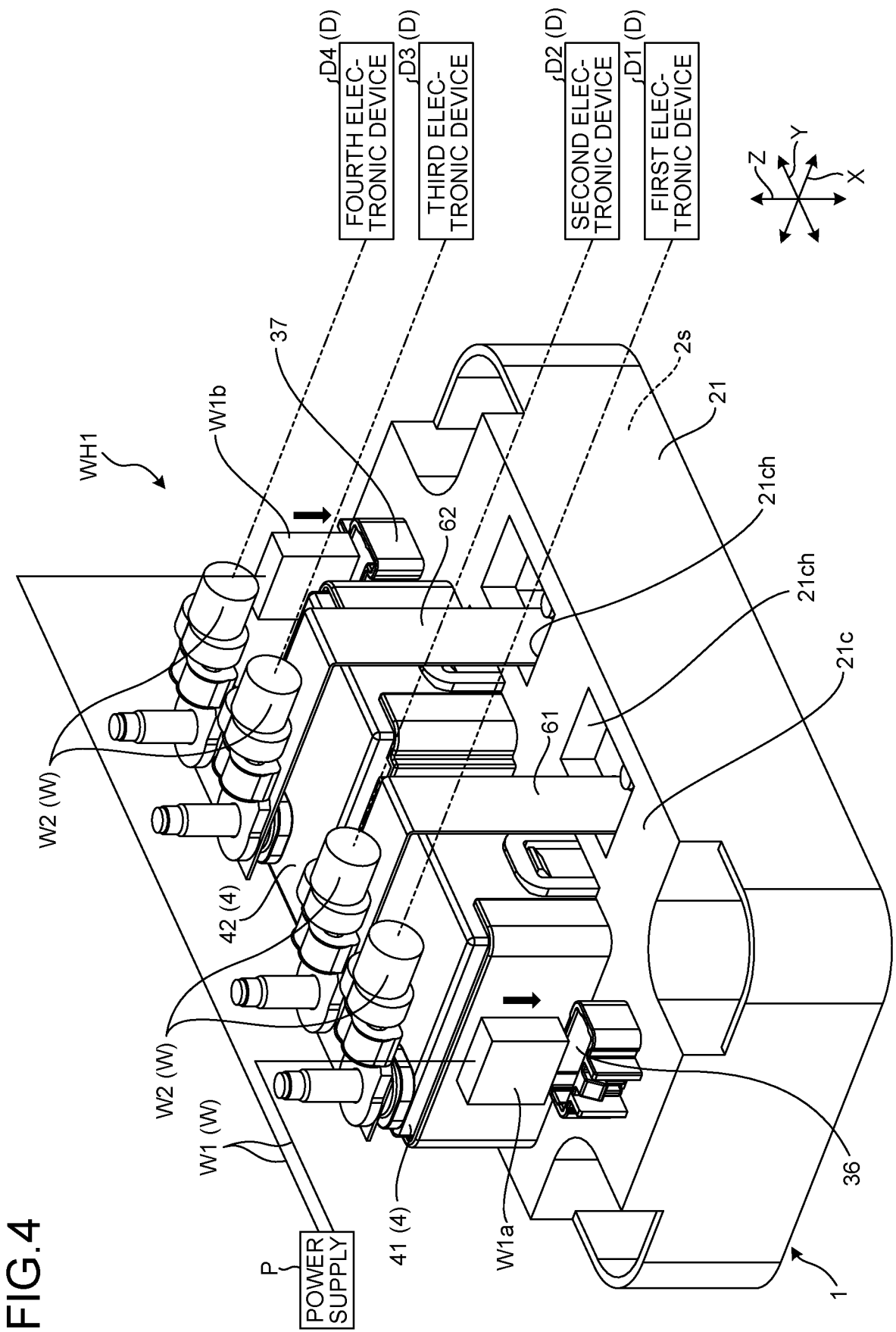
FIG. 4 is a perspective view illustrating the inside of the branch box housing according to the present embodiment.
Figure 5:
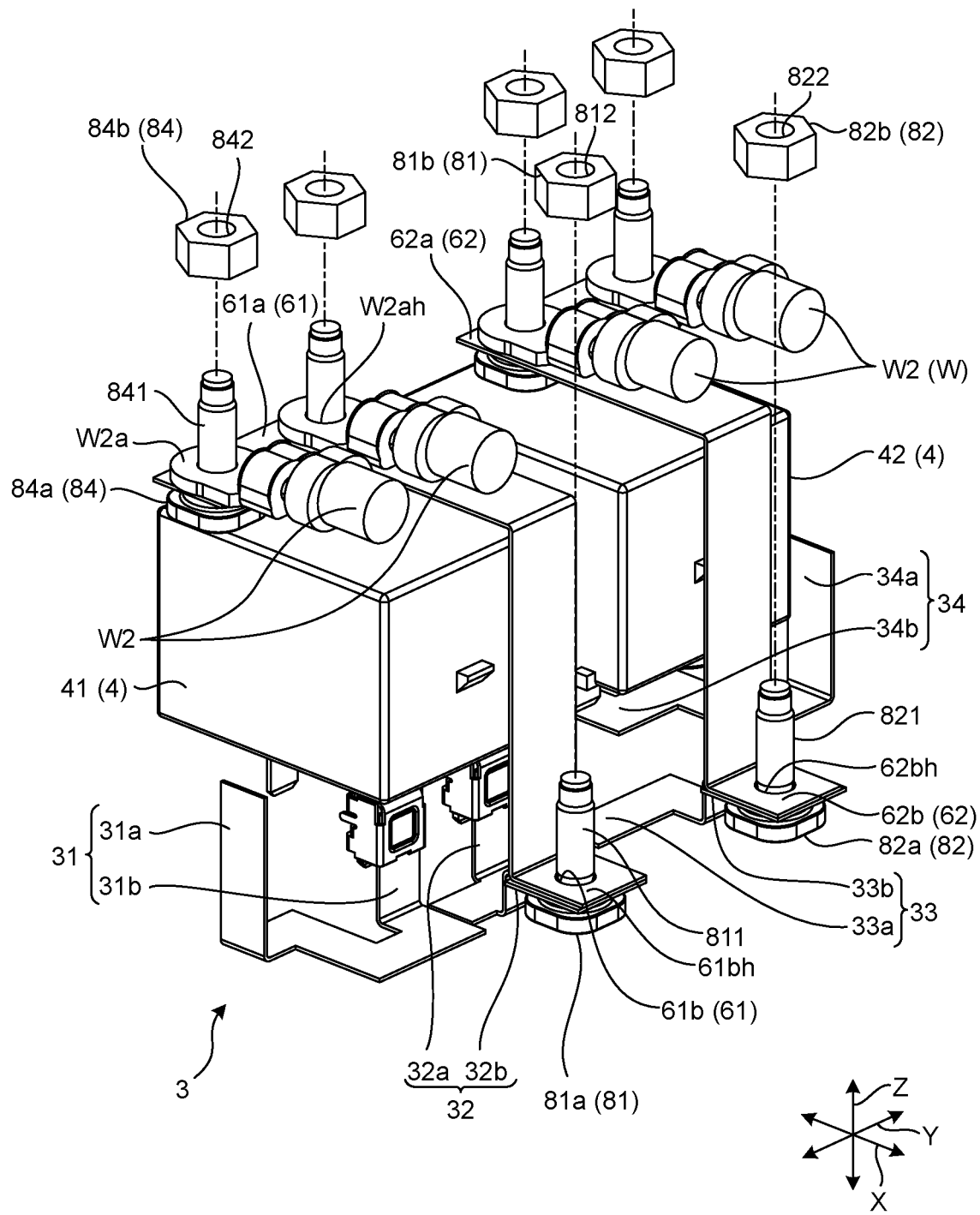
FIG. 5 is a perspective view illustrating a connection box bus bar and a branch box bus bar according to the present embodiment.
Figure 6:
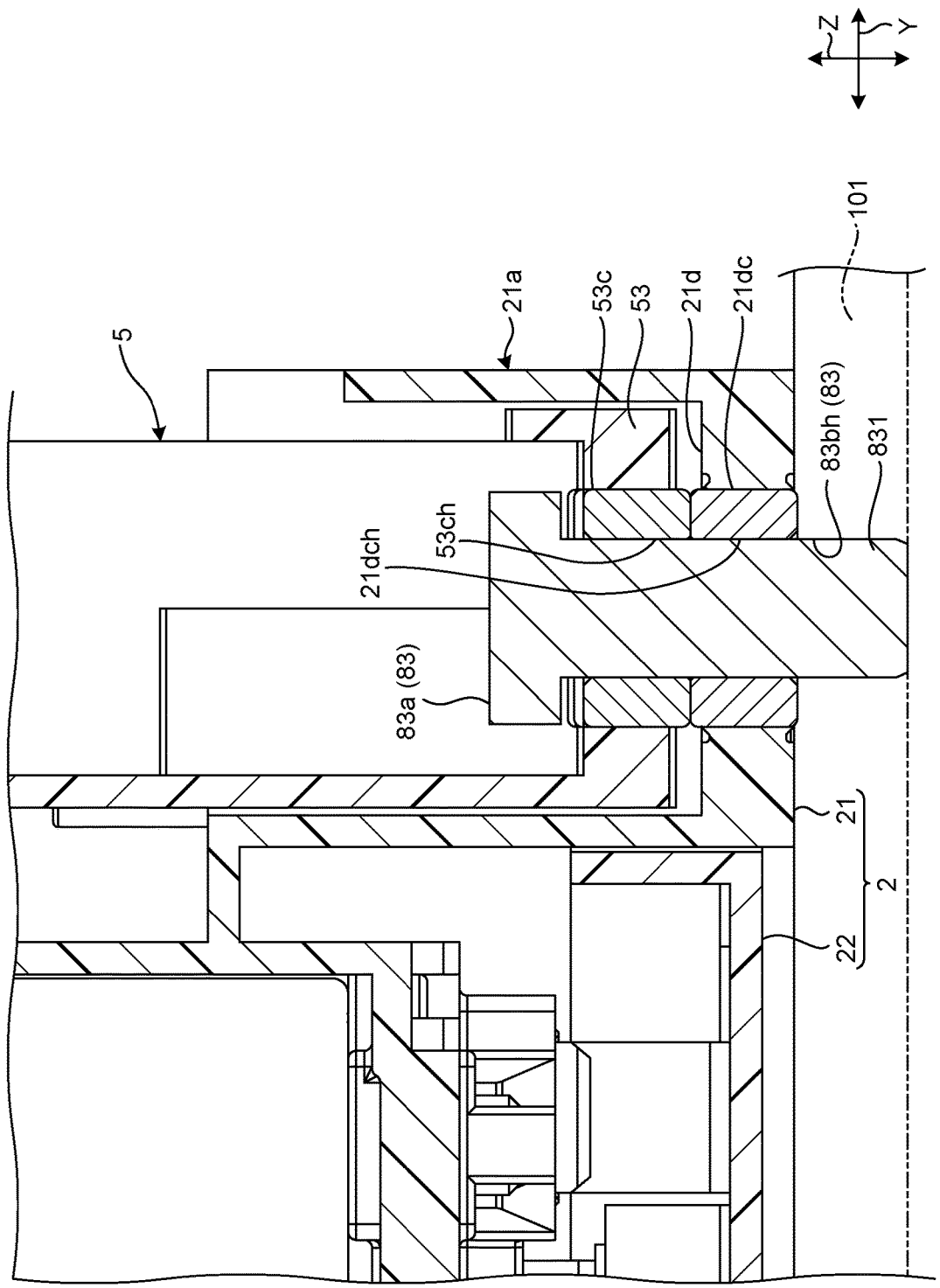
FIG. 6 is a cross-sectional view illustrating a leg portion of the branch box housing and a contact portion of a connection box housing, which is in contact with the leg portion, in the electrical connection box according to the present embodiment.

FIG. 1 is a perspective view of an electrical connection box 1 according to the present embodiment. FIG. 2 is an exploded perspective view of the electrical connection box 1 according to the present embodiment. FIG. 3 is a perspective view of a branch box housing 5 included in the electrical connection box 1 according to the present embodiment. FIG. 4 is a perspective view illustrating the inside of the branch box housing 5 according to the present embodiment. FIG. 5 is a perspective view illustrating a connection box bus bar 3 and a branch box bus bar 6 according to the present embodiment. FIG. 6 is a cross-sectional view illustrating a leg portion of the branch box housing 5 and a contact portion of a connection box housing 2, which is in contact with the leg portion, in the electrical connection box 1 according to the present embodiment. FIG. 7 is a plan view of the connection box housing 2 of the electrical connection box according to the present embodiment. FIG. 8 is a bottom view of the branch box housing 5 of the electrical connection box according to the present embodiment.

Further, in FIGS. 1 to 8, Z represents the vertical direction of the electrical connection box 1, X represents a first orthogonal direction orthogonal to the vertical direction Z in the electrical connection box 1, and Y represents a second orthogonal direction orthogonal to the vertical direction Z and the first orthogonal direction X in the electrical connection box 1. The first orthogonal direction X, the second orthogonal direction Y, and the vertical direction Z are orthogonal to each other.

Embodiment

The electrical connection box 1 according to the present embodiment illustrated in FIG. 1 is installed in a vehicle such as an automobile and incorporated into a wire harness WH1. The wire harness WH1 is, for example, used for connection with respective electronic devices D (see FIG. 4) installed in a vehicle. The wire harness WH1 is an assembled part in which a plurality of wiring materials W for the power supply or signal communication is bundled and is used for connecting the plurality of wiring materials W to the respective electronic devices D using a connector or the like. The wire harness WH1 includes the conductive wiring material W and the electrical connection box 1 that is electrically connected to the wiring material W. The wiring material W includes, for example, a metal rod, an electric wire, an electric wire bundle, or the like. The metal rod includes a conductive rod-shaped member having an outer side covered with an insulating covering portion. The electric wire includes a conductor portion (core wire) having an outer side covered with an insulating covering portion, and the conductor portion is made of a plurality of conductive metal strands. The electric wire bundle is a bundle of electric wires. In the wire harness WH1, the plurality of wiring materials W is bundled and tied, and the electrical connection box 1 is electrically connected to the wire harness through a connector or the like provided at the end portion of the bundled wiring materials W. The wire harness WH1 can further include a grommet, a protector, an exterior material, a fixture, and the like.

The electrical connection box 1 is an assembled part of electrical components such as connectors, fuses, relays, capacitors, branch portions, and electronic control units, which are stored therein. The electrical connection box 1 is installed in, for example, the engine room or the interior of a vehicle. The electrical connection box 1 is connected between a power supply P such as a battery or a generator and various electronic devices D attached to the inside of the vehicle through a power supply line W1 and an electric wire W2 included in the wiring material W, as illustrated in FIG. 4. The electrical connection box 1 distributes the electric power supplied from the power supply P to the various electronic devices D in the vehicle. More specifically, the electrical connection box 1 uses a first electronic device D1 described later to distribute the electric power supplied from the power supply P to the first electronic device D1 and a second electronic device D2. In addition, the electrical connection box 1 uses the second electronic component 42 described later to distribute the electric power supplied from the power supply P to a third electronic device D3 and a fourth electronic device D4. The electrical connection box 1 is also referred to as a junction box, a fuse box, a relay box, or the like in some cases, but in the present embodiment, these are collectively referred to as the electrical connection box 1. The configuration of the electrical connection box 1 is now described in detail with reference to each drawing.

The electrical connection box 1 includes an insulating connection box housing 2 and an insulating branch box housing 5. The insulating connection box housing 2 has a connection box storing space 2s therein, and the insulating branch box housing 5 has a branch box storing space 5s therein. Then, the electrical connection box 1 is provided with a fixing mechanism 7, which is provided between the connection box housing 2 and the branch box housing 5 and directly fixes the branch box housing 5 to the connection box housing 2 (see FIGS. 7 and 8).

The connection box housing 2 according to the present embodiment includes a plurality of conductive connection box bus bars 3 illustrated in FIG. 5 in the connection box storing space 2s. In other words, the electrical connection box 1 includes the insulating connection box housing 2 that stores the conductive connection box bus bar 3 therein.

The connection box housing 2 has the connection box housing body 21, which forms the connection box storing space 2s, and a connection box housing bottom portion 22 as illustrated in FIGS. 1 and 2. The connection box housing body 21 has, as illustrated in FIG. 7, a pair of first connection box housing-facing walls 21a, a pair of second connection box housing-facing walls 21b, and a connection box housing top portion 21c. The pair of first connection box housing-facing walls 21a faces each other in the first orthogonal direction X. The pair of second connection box housing-facing walls 21b faces each other in the second orthogonal direction Y. The connection box housing top portion 21c faces the connection box housing bottom portion 22 in the vertical direction Z.

The connection box housing top portion 21c is located above the connection box housing 2 in the vertical direction Z. Then, the connection box housing top portion 21c is provided with first and second connectors 36 and 37 and two top through-holes 21ch. The first connector 36 and the second connector 37 are provided on the connection box housing top portion 21c while being exposed to the outside in a state where the branch box housing 5 is attached to the connection box housing 2. Each of the top through-holes 21ch penetrates the connection box housing top portion 21c in the vertical direction Z, communicating the connection box storing space 2s with the outside. The connection box housing bottom portion 22 is provided with two bottom through-holes 22ch. Each bottom through-hole 22ch penetrates the connection box housing bottom portion 22 in the vertical direction Z, communicating the connection box storing space 2s with the outside. A screw portion 811 of a first bolt 81a described later is inserted through one bottom through-hole 22ch. A screw portion 821 of a second bolt 82a described later is inserted through another bottom through-hole 22ch.

Then, the connection box housing 2 according to the present embodiment has a connection box housing contact portion (contact parts) 21d at every four corners of the connection box housing body 21 in the horizontal plane including the first orthogonal direction X and the second orthogonal direction Y. The connection box housing contact portion 21d is in direct contact with each of branch box housing leg portions 53 described below.

The connection box housing contact portion 21d has a contact portion through-hole that penetrates the connection box housing contact portion 21d in the vertical direction z as illustrated in FIG. 6. Then, the connection box housing contact portion 21d is provided with a second metal collar 21dc. More specifically, the connection box housing contact portion 21d is provided with the second collar 21dc that fits into the contact portion through-hole. The second collar 21dc has a second collar through-hole 21dch that penetrates the second collar 21dc in the vertical direction. Then, a screw portion 831 of a third bolt 83a in a fixed fastening member 83 is inserted through the contact portion through-hole and the second collar through-hole 21dch and the screw portion 831 is screwed into a screw hole 83b that is formed in a plate portion 101 of a vehicle, thereby attaching the electrical connection box 1 to the plate portion of the vehicle. In addition, the fixed fastening member 83 according to the present embodiment includes a screw hole 83*bh* formed in the plate portion 101 of the vehicle and a third bolt 83*a*. In addition, the plate portion 101 in which the screw hole 83*bh* is formed serves as an attached portion to which the electrical connection box 1 is attached in the vehicle.

The connection box bus bar 3 includes a first connection box bus bar 31, a second connection box bus bar 32, a third connection box bus bar 33, and a fourth connection box bus bar 34, as illustrated in FIG. 5. In addition, the connection box housing according to the present embodiment includes a plurality of electronic components 4 so that a part of each of the electronic components 4 is exposed from above, as illustrated in FIG. 4. Then, the electronic component 4 according to the present embodiment includes a first electronic component 41 and a second electronic component 42.

The first connection box bus bar 31 has a tip portion 31*a* electrically connected to the first connector 36 (see FIG. 4). The first connector 36 is attachable or detachable to or from a first terminal W1*a* provided at the end of the power supply line W1 connected to the power supply P as illustrated in FIG. 4. The first connection box bus bar 31 has another tip portion 31*b* electrically connected to the first electronic component 41, as illustrated in FIG. 5.

The second connection box bus bar 32 has a tip portion 32*a* electrically connected to the first electronic component 41. Another tip portion of the second connection box bus bar 32 (hereinafter, referred to as "the second connection box bus bar tip portion 32*b*") includes a though-hole penetrating the second connection box bus bar tip portion 32*b* in the vertical direction Z. Then, the second connection box bus bar tip portion 32*b* is brought into direct contact with the other tip portion of the first branch box bus bar 61 (hereinafter, referred to as "the first branch box bus bar tip portion 61*b*"). The first branch box bus bar tip portion 61*b* has a through-hole 61*bh* penetrating the first branch box bus bar tip portion 61*b* in the vertical direction Z (see FIG. 3). Then, the screw portion 811 of the first bolt 81*a* in a first bus bar fastening member 81 is inserted into a through-hole of the second connection box bus bar tip portion 32*b* and a through-hole 61*bh* of the first branch box bus bar tip portion 61*b* so that the second connection box bus bar tip portion 32*b* and the first branch box bus bar tip portion 61*b* are brought into direct contact with each other. In this state, screwing the screw portion 811 of the first bolt 81*a* into a screw hole 812 of a first nut 81*b* fastens the second connection box bus bar tip portion 32*b* to the first branch box bus bar tip portion 61*b* together using the first bus bar fastening member 81. In other words, the second connection box bus bar 32 and the first branch box bus bar 61 are electrically connected by jointly fastening the tip portions using the first bus bar fastening member 81 in the state where the second connection box bus bar tip portion 32*b* is in direct contact with the first branch box bus bar tip portion 61*b*.

The first bus bar fastening member 81 includes the first bolt 81*a* and the first nut 81*b*. The first nut 81*b* has the screw hole 812 screwed into the screw portion 811 of the first bolt 81*a*.

The third connection box bus bar 33 has a tip portion 33*a* electrically connected to the second electronic component 42. Another tip portion of the third connection box bus bar 33 (hereinafter, referred to as "the third connection box bus bar tip portion 33*b*") includes a though-hole penetrating the third connection box bus bar tip portion 33*b* in the vertical direction Z. Then, the third connection box bus bar tip portion 33*b* is brought into direct contact with the other tip portion of the second branch box bus bar 62 (hereinafter, referred to as "the second branch box bus bar tip portion 62*b*"). The second branch box bus bar tip portion 62*b* has a through-hole 62*bh* penetrating the second branch box bus bar tip portion 62*b* in the vertical direction Z (see FIG. 3). Then, the screw portion 821 of the second bolt 82*a* in a second bus bar fastening member 82 is inserted into a through-hole of the third connection box bus bar tip portion 33*b* and a through-hole 62*bh* of the second branch box bus bar tip portion 62*b* so that the third connection box bus bar tip portion 33*b* and the second branch box bus bar tip portion 62*b* are brought into direct contact with each other. In this state, screwing the screw portion 821 of the second bolt 82*a* into a screw hole 822 of a second nut 82*b* fastens the third connection box bus bar tip portion 33*b* to the second branch box bus bar tip portion 62*b* together using the second bus bar fastening member 82. In other words, the third connection box bus bar 33 and the second branch box bus bar 62 are electrically connected by jointly fastening the tip portions using the second bus bar fastening member 82 in the state where the third connection box bus bar tip portion 33*b* is in direct contact with the second branch box bus bar tip portion 62*b*.

The second bus bar fastening member 82 includes the second bolt 82*a* and the second nut 82*b*. The second nut 82*b* has the screw hole 822 screwed into the screw portion 821 of the second bolt 82*a*.

The fourth connection box bus bar 34 has a tip portion 34*a* electrically connected to the second connector 37 (see FIG. 4). The second connector 37 is attachable or detachable to or from a second terminal W1*b* provided at the end of the power supply line W1 connected to the power supply P as illustrated in FIG. 4. The fourth connection box bus bar 34 has another tip portion 34*b* electrically connected to the second electronic component 42, as illustrated in FIG. 5.

The first electronic component 41 and the second electronic component 42 are, for example, relays. More specifically, the first electronic component 41 distributes the electric power supplied from the power supply P to the first electronic device D1 and the second electronic device D2 as necessary. In addition, the second electronic component 42 distributes the electric power supplied from the power supply P to the third electronic device D3 and the fourth electronic device D4 as necessary.

The connection box housing body 21 and each electronic component 4 are provided with a locking mechanism 74 that locks each electronic component 4 to the connection box housing body 21. The locking mechanism 74 includes, for example, a locking claw 75 and a locking hole portion 76. The locking claw 75 is provided in the electronic component 4. The locking hole portion 76 is provided in the connection box housing body and is engageable with the locking claw 75.

The branch box housing 5 according to the present embodiment includes a plurality of conductive branch box bus bars 6 in the branch box storing space 5*s* illustrated in FIG. 3 (see FIG. 5). In other words, the electrical connection box 1 includes the insulating branch box housing 5 that stores the conductive branch box bus bar 6 therein.

The branch box housing 5 has a branch box housing body 51, which forms the branch box storing space 5*s* therein, and a branch box housing lid 52, as illustrated in FIG. 2.

The branch box housing body 51 has, as illustrated in FIG. 8, a pair of first branch box housing-facing walls 51*a*, a pair of second branch box housing-facing walls 51*b*, and a branch box housing bottom portion 51c. The pair of first branch box housing-facing walls 51a faces each other in the first orthogonal direction X. The pair of second branch box housing-facing walls 51b faces each other in the second orthogonal direction Y. The branch box housing bottom portion 51c faces the branch box housing lid 52 at the fully closed position in the vertical direction Z One first branch box housing-facing wall 51a of the pair of first branch box housing-facing walls 51a is provided with two first facing wall through-holes. Each first facing wall portion through-hole penetrates the first branch box housing-facing wall 51a in the second orthogonal direction Y to communicate the branch box storing space 5s with the outside.

The electrical connection box 1 according to the present embodiment is provided with the rotation support mechanism 9 that supports in such a manner that the branch box housing lid 52 is rotated around a rotation shaft 9x with respect to the branch box housing body 51 between the branch box housing body 51 and the branch box housing lid 52 as illustrated in FIG. 1. The rotation support mechanism 9 includes a cylindrical portion 91 and a support receiving portion 92. The cylindrical portion 91 is provided on the branch box housing lid 52, and the support receiving portion 92 is provided on the branch box housing body 51 and supports in such a manner that the cylindrical portion 91 is rotated around the rotation shaft 9x. The rotation support mechanism 9 according to the present embodiment is, for example, a hinge.

Then, in the electrical connection box 1, the branch box bus bar 6 is exposed to the outside in the state where the branch box housing lid 52 opens with respect to the branch box housing body 51. On the other hand, in the electrical connection box 1, the branch box bus bar 6 closes inside the branch box storing space 5s in the state where the branch box housing lid 52 closes with respect to the branch box housing body 51.

Furthermore, the branch box housing 5 has the branch box housing leg portion (leg parts) 53 extending from the upper side to the lower side of the branch box housing body 51 in the vertical direction Z as illustrated in FIG. 3. The branch box housing 5 according to the present embodiment has the branch box housing leg portion 53 at every four corners of the branch box housing body 51 in a horizontal plane including the first orthogonal direction X and the second orthogonal direction Y as illustrated in FIG. 8. Each branch box housing leg portion 53 is provided with a first metal collar 53c.

The branch box bus bar 6 includes the first branch box bus bar 61 and the second branch box bus bar 62 as illustrated in FIG. 5.

The first branch box bus bar 61 has one tip portion 61a with a through-hole penetrating the tip portion 61a in the vertical direction Z. Then, the tip portion is brought into direct contact with an electric wire terminal W2a provided at one end of the electric wire W2 described above. Each electric wire terminal W2a has a terminal through-hole W2ah penetrating the terminal W2a in the vertical direction Z. Then, a screw portion 841 of a fourth bolt 84a in an electric wire fastening member 84 is inserted into the through-hole of the tip portion 61a and the terminal through-hole W2ah, and so the tip portion 61a of the first branch box bus bar 61 and the wire terminal W2a are brought into direct contact with each other. In this state, screwing the screw portion 841 of the fourth bolt 84a into a screw hole 842 of a fourth nut 84b fastens the tip portion 61a of the first branch box bus bar 61 to the electric wire terminal W2a provided in one end of the electric wire W2 together by using the electric wire fastening member 84.

The first branch box bus bar tip portion 61b of the first branch box bus bar 61 has a through-hole 61bh penetrating the first branch box bus bar tip portion 61b in the vertical direction Z (see FIG. 3). Then, the first branch box bus bar tip portion 61b and the second connection box bus bar tip portion 32b are electrically connected by fastening them together using the first bus bar fastening member 81 in a state where they are brought into direct contact with each other.

The tip portion 61a of the first branch box bus bar 61 is located inside the branch box storing space 5s. In addition, the first branch box bus bar 61 is inserted through one of the first facing wall portion through-holes, and so a part of the first branch box bus bar 61 is located outside. The first branch box bus bar 61 is inserted through one of the top through-holes 21ch, and so the first branch box bus bar tip portion 61b is located inside the connection box storing space 2s. Thus, a part of the first branch box bus bar 61 is exposed to the outside, but in the part exposed to the outside, another device is arranged adjacent to the electrical connection box 1 in the vehicle, so the operator does not touch the part of the first branch box bus bar 61 exposed to the outside.

The second branch box bus bar 62 has one tip portion 62a with a through-hole penetrating the tip portion 62a in the vertical direction Z. Then, the tip portion is brought into direct contact with an electric wire terminal W2a provided at one end of the electric wire W2 described above. Each electric wire terminal W2a has a terminal through-hole W2ah penetrating the terminal W2a in the vertical direction Z. Then, a screw portion 841 of a fourth bolt 84a in an electric wire fastening member 84 is inserted into the through-hole of the tip portion 62a and the terminal through-hole W2ah, and so the tip portion 62a of the second branch box bus bar 62 and the wire terminal W2a are brought into direct contact with each other. In this state, screwing the screw portion 841 of the fourth bolt 84a into a screw hole 842 of a fourth nut 84b fastens the tip portion 62a of the second branch box bus bar 62 to the electric wire terminal W2a provided in one end of the electric wire W2 together by using the electric wire fastening member 84.

The second branch box bus bar tip portion 62b of the second branch box bus bar 62 has a through-hole 62bh penetrating the second branch box bus bar tip portion 62b in the vertical direction Z (see FIG. 3). Then, the second branch box bus bar tip portion 62b and the third connection box bus bar tip portion 33b are electrically connected by fastening them together using the second bus bar fastening member 82 in a state where they are brought into direct contact with each other.

The tip portion 62a of the second branch box bus bar 62 is located inside the branch box storing space 5s. In addition, the second branch box bus bar 62 is inserted through the other first facing wall portion through-hole, and so a part of the second branch box bus bar 62 is located outside. The second branch box bus bar 62 is inserted through the other top through-hole 21ch, and so the second branch box bus bar tip portion 62b is located inside the connection box storing space 2s. Thus, a part of the second branch box bus bar 62 is exposed to the outside, but in the part exposed to the outside, another device is arranged adjacent to the electrical connection box 1 in the vehicle, so the operator does not touch the part of the second branch box bus bar 62 exposed to the outside.

In the electrical connection box 1, the electrical connection between the components as described above enables the power supply P and the first electronic device D1 to be electrically connected and the power supply P and the second electronic device D2 to be electrically connected in the state where the first electronic component 41 is interposed. Then, in the electrical connection box 1, the first electronic device D1 or the second electronic device D2 is supplied with the electric power from the power supply P by turning on a switch of the first electronic component 41 on the basis of a command from the ECU provided in the vehicle. In addition, in the electrical connection box 1, the power supply from the power supply P to the first electronic device D1 or the second electronic device D2 is cut off by turning off the switch of the first electronic component 41 on the basis of the command from the ECU provided in the vehicle.

In the electrical connection box 1, the electrical connection between the components as described above enables the power supply P and the third electronic device D3 to be electrically connected and the power supply P and the fourth electronic device D4 to be electrically connected in the state where the second electronic component 42 is interposed. Then, in the electrical connection box 1, the third electronic device D3 or the fourth electronic device D4 is supplied with the electric power from the power supply P by turning on a switch of the second electronic component 42 on the basis of a command from the ECU provided in the vehicle. In addition, in the electrical connection box 1, the power supply from the power supply P to the third electronic device D3 or the fourth electronic device D4 is cut off by turning off the switch of the second electronic component 42 on the basis of the command from the ECU provided in the vehicle.

The fixing mechanism 7 has a rib 71 provided on the branch box housing 5 and a press-fitted portion 72 to which the rib 71 provided on the connection box housing 2 is allowed to be press-fitted. The electrical connection box 1 according to the present embodiment has one fixing mechanism 7.

The rib 71 is located between two branch box housing leg portion 53 when viewed from one side of the first orthogonal direction X and is located between two branch box housing leg portions 53 when viewed from one side of the second orthogonal direction Y, as illustrated in FIG. 8.

The press-fitted portion 72 is located between two connection box housing contact portions 21d when viewed from one side of the first orthogonal direction X and is located between two connection box housing contact portions 21d when viewed from one side of the second orthogonal direction Y, as illustrated in FIG. 7.

The rib 71 extends downward from the lower surface of the branch box housing bottom portion 51c in the vertical direction as illustrated in FIG. 8. In addition, the rib 71 has a first linear portion 71a extending in the first orthogonal direction X and a second linear portion 71b extending in the second orthogonal direction Y when viewed from below in the vertical direction. Then, the rib 71 is formed in a cross shape in which the center in the first linear portion 71a in the first orthogonal direction intersects the center in the second linear portion 71b in the second orthogonal direction Y When viewed from below in the vertical direction.

The press-fitted portion 72 extends upward from the upper surface of the connection box housing top portion 21c in the vertical direction as illustrated in FIGS. 2 and 7. In addition, the press-fitted portion 72 has a first portion 72a located on one side in the first orthogonal direction X and a second portion 72b located on the other side in the first orthogonal direction X when viewed from above in the vertical direction. In the first orthogonal direction X, a press-fitting space portion 72s that press-fits the rib 71 is formed between the first portion 72a and the second portion 72b.

The first portion 72a includes a first linear portion extending in the second orthogonal direction Y and a pair of second protrusions that protrude from both ends of the first linear portion in a direction close to the second portion 72b, and so forms a C shape. Then, in the first portion 72a, a first space is formed between a pair of first protrusions in the second orthogonal direction Y.

The second portion 72b includes a second linear portion extending in the second orthogonal direction Y and a pair of second protrusions that protrude from both ends of the second linear portion in a direction close to the first portion 72a, and so forms a C shape. Then, in the second portion 72b, a second space is formed between a pair of second protrusions in the second orthogonal direction Y.

Then, in the press-fitted portion 72 of the fixing mechanism 7, the separation interval between the first portion 72a and the second portion 72b in the first orthogonal direction X in the non-press-fitted state in which the rib 71 and the press-fitted portion 72 are separated in the vertical direction Z is larger than the separation interval between the first portion 72a and the second portion 72b in the state where the rib 71 is press-fitted into the press-fitted portion 72.

In the fixing mechanism 7, in the state where the rib 71 is press-fitted into the press-fitted portion 72, one end of the first linear portion 71a of the rib 71 is press-fitted into the first space of the first portion 72a in the press-fitted portion 72, and the other end of the first linear portion 71a of the rib 71 is press-fitted into the second space of the second portion 72b of the press-fitted portion 72. Furthermore, in the fixing mechanism 7, in the state where the rib 71 is press-fitted into the press-fitted portion 72, one end of the second linear portion 71b of the rib 71 is press-fitted between one first protrusion and one second protrusion in the press-fitted portion 72, and the other end of the second linear portion 71b of the rib 71 is press-fitted between the other first protrusion and the other second protrusion in the press-fitted portion 72.

Moreover, the above description is given of the fixing mechanism 7 according to the present embodiment in which the rib 71 is provided on the branch box housing 5 and the press-fitted portion 72 is provided on the connection box housing 2. However, the fixing mechanism 7 according to the present embodiment is not limited to this exemplary configuration. In one example, in the fixing mechanism 7 according to the present embodiment, the press-fitted portion 72 may be provided on the branch box housing 5, and the rib 71 may be provided on the connection box housing 2. In other words, the fixing mechanism 7 according to the present embodiment has the rib 71 and the press-fitted portion 72. The rib 71 is provided on one housing of the connection box housing 2 and the branch box housing 5, and the press-fitted portion 72 to which the rib 71 provided on the other housing is allowed to be press-fitted.

The assembly of the electrical connection box 1 according to the present embodiment is now described. The operator first fixes the connection box housing 2 at a predetermined position and then arranges the branch box housing 5 above the connection box housing 2 in the vertical direction Z.

Next, the operator matches the position of the press-fitted portion 72 in the first orthogonal direction X and the second orthogonal direction Y with the position of the rib 71 in the first orthogonal direction X and the second orthogonal direction Y.

Subsequently, the operator shifts the branch box housing 5 from the upper side to the lower side in the vertical direction Z to press-fit the rib 71 into the press-fitted portion 72.

In the state where the rib 71 is press-fitted into the press-fitted portion 72, the electrical connection box 1 is capable of matching the positions of the connection box bus bar tip portions 32b and 33b with the positions of the branch box bus bar tip portions 61b and 62b. In addition, in the state where the rib 71 is press-fitted into the press-fitted portion 72, the electrical connection box 1 is capable of matching the position of the connection box housing contact portion 21d with the position of the branch box housing leg portion 53.

Then, the operator fastens the second connection box bus bar tip portion 32b and the first branch box bus bar tip portion 61b using the first bus bar fastening member 81.

Then, the operator fastens the third connection box bus bar tip portion 33b and the second branch box bus bar tip portion 62b using the second bus bar fastening member 82.

Finally, the operator fastens each connection box housing contact portion 21d and the branch box housing leg portion 53 using the fixed fastening member 83 and arranges the branch box housing 5 above the connection box housing 2 in the vertical direction Z. At the same time, the operator fixes the electrical connection box 1 to the plate portion 101 that is the attached portion of the vehicle.

The electrical connection box 1 according to the present embodiment has the following configuration. The connection box bus bar 3 and the branch box bus bar 6 are electrically connected by jointly fastening the tip portions using the bus bar fastening members 81 and 82 in the state where the connection box bus bar tip portions 32b and 33b are in direct contact with the branch box bus bar tip portions 61b and 62b. Thus, according to the present embodiment, the electrical connection box 1 eliminates the need to provide an electronic component or an intermediate bus bar that electrically connects the connection box bus bar 3 with the branch box bus bar 6. Thus, according to the present embodiment, it is possible for the electrical connection box 1 to eliminate the work of electrically connecting the connection box bus bar 3, the intermediate bus bar, or the like, and to eliminate the work of electrically connecting the branch box bus bar 6, the intermediate bus bar, or the like. Accordingly, the electrical connection box 1 according to the present embodiment is capable of facilitating the electrical connection work between the connection box bus bar 3 and the branch box bus bar 6.

The electrical connection box 1 according to the present embodiment has the following configuration. The connection box housing 2 and the branch box housing 5 are fixed to the vehicle by jointly fastening the leg portion 53 and the contact portion 21d using the fixed fastening member 83 in the state where the leg portion 53 and the contact portion 21d are in direct contact with the plate portion 101 that is the attached portion provided on the vehicle. Thus, the electrical connection box 1 according to the present embodiment eliminates the need to separately perform the work of fixing the connection box housing 2 to the attached portion of the vehicle and the work of fixing the branch box housing 5 to the attached portion of the vehicle. Accordingly, according to the present embodiment, it is possible to facilitate the work to fix the electrical connection box 1 to the vehicle.

The electrical connection box 1 according to the present embodiment has the following configuration. The fixing mechanism 7 used to directly fix the branch box housing 5 to the connection box housing 2 is provided between the connection box housing 2 and the branch box housing 5. The fixing mechanism 7 has the rib 71 provided on one housing of the connection box housing 2 and the branch box housing 5 and the press-fitted portion 72 to which the rib 71 provided on the other housing is allowed to be press-fitted. Thus, the electrical connection box 1 according to the present embodiment makes it possible to directly fix the branch box housing 5 and the connection box housing 2 to each other using the fixing mechanism 7. Accordingly, the electrical connection box 1 according to the present embodiment is capable of fixing the branch box housing 5 the connection box housing 2 with reliability. In addition, in the state where the branch box housing 5 is fixed to the connection box housing 2 using the fixing mechanism 7, it is possible to match the positions of the connection box bus bar tip portions 32b and 33b into the positions of the branch box bus bar tip portions 61b and 62b. Thus, it is possible to facilitate positioning of the branch box bus bar tip portions 61b and 62b with respect to the connection box bus bar tip portions 32b and 33b. Furthermore, it is possible to match the position of the contact portion 21d with the position of the leg portion 53 in the state where the branch box housing 5 is fixed to the connection box housing 2 using the fixing mechanism 7. Thus, it is possible to facilitate positioning of the leg portion 53 with respect to the contact portion 21d.

The electrical connection box 1 according to the present embodiment has the following configuration. The leg portion 53 is provided with a first metal collar 53c, the contact portion 21d is provided with the second metal collar 21dc, and the fixed fastening member 83 is made of metal. Thus, in the electrical connection box 1 according to the present embodiment, even if the connection box housing 2 made of synthetic resin and the branch box housing 5 made of synthetic resin are used, it is possible to apply the fastening force of the metal fixed fastening member 83 to the leg portion 53 and the contact portion 21d by the first metal collar 53c and the second metal collar 21dc. Accordingly, according to the present embodiment, it is possible to fix the electrical connection box 1 to the vehicle with more reliability.

Moreover, in the electrical connection box 1 according to the embodiment described above, the connection box housing 2 is arranged below in the vertical direction z, while the branch box housing 5 is arranged above the connection box housing 2 in the vertical direction Z. However, the electrical connection box 1 according to the present embodiment is not limited to this exemplary configuration, and the branch box housing 5 may be arranged below in the vertical direction Z, while the connection box housing 2 may be arranged above the branch box housing 5 in the vertical direction z.

Further, the above description is given of the electrical connection box 1 according to the embodiment, which stores a part of the electronic component 4 inside the connection box housing 2 and a part of the electronic component 4 inside the branch box housing 5. However, the electrical connection box 1 according to the present embodiment is not limited to this exemplary configuration. Specifically, the entire electronic component 4 may be stored inside the connection box housing 2, and the electronic component 4 may not be stored inside the branch box housing 5.

Further, the above description is given of the electrical connection box 1 according to the embodiment, which stores the entire electronic component 4 inside the connection box housing 2 and does not store the electronic component 4 inside the branch box housing 5. However, the electrical connection box 1 according to the present embodiment is not limited to this exemplary configuration. For example, the electrical connection box 1 may store the entire electronic component 4 inside the branch box housing 5, and the electronic component 4 may not be stored inside the connection box housing 2. In addition, the electrical connection box 1 may store the entire electronic component 4 inside the connection box housing 2 and may store other electronic components 4 different from the electronic component 4 inside the branch box housing 5.

Further, the above description is given of the locking mechanism 74 according to the embodiment having the locking claw 75 provided in the electronic component 4 and the locking hole portion 76 provided in the connection box housing body 21. However, the locking mechanism 74 according to the present embodiment is not limited to this exemplary configuration, and the locking claw 75 may be provided in the connection box housing body 21, while the locking hole portion 76 may be provided in the electronic component 4.

Furthermore, the shape of the rib 71 of the fixing mechanism 7 and the shape of the press-fitted portion 72 are not limited to those described above, and can be modified as appropriate.

Further, in the rotation support mechanism 9 according to the embodiment described above, the branch box housing body 51 is provided with the cylindrical portion 91, while the branch box housing lid 52 is provided with the support receiving portion 92. However, the rotation support mechanism 9 according to the present embodiment is not limited to this exemplary configuration. In one example, in the rotation support mechanism 9 according to the present embodiment, the branch box housing body 51 may be provided with the support receiving portion 92, while the branch box housing lid 52 may be provided with the cylindrical portion 91.

According to the present embodiment, the electrical connection box having the configuration described above is capable of facilitating the electrical connection work between the connection box bus bar and the branch box bus bar.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
   a connection box housing having an insulation property configured to store a connection box bus bar having conductivity inside the connection box housing; and
   a branch box housing having an insulation property configured to store a branch box bus bar having conductivity inside the branch box housing;
   wherein the branch box housing and the connection box housing are stacked in a vertical direction, and
   the connection box bus bar and the branch box bus bar are electrically connected by bringing a connection box bus bar tip portion of the connection box bus bar into direct contact with a branch box bus bar tip portion of the branch box bus bar and by jointly fastening the tip portions using a bus bar fastening member in a state in which the connection box bus bar tip portion is in direct contact with the branch box bus bar tip portion.

2. The electrical connection box according to claim 1, wherein
   the branch box housing has a branch box housing body and a leg portion extending from above to below in the vertical direction of the branch box housing body,
   the connection box housing has a contact portion being in direct contact with the leg portion in the vertical direction, and
   the connection box housing and the branch box housing are fixed to a vehicle by jointly fastening the leg portion and the contact portion using a fixed fastening member in a state in which the leg portion and the contact portion are in direct contact with respect to an attached portion provided in the vehicle.

3. The electrical connection box according to claim 2, further comprising:
   a fixing mechanism provided between the connection box housing and the branch box housing and configured to directly fix the branch box housing to the connection box housing,
   wherein the fixing mechanism has a rib provided on one housing of the connection box housing and the branch box housing and a press-fitted portion to which the rib provided on the other housing is allowed to be press-fitted.

4. The electrical connection box according to claim 2,
   wherein the leg portion is provided with a first metal collar,
   the contact portion is provided with a second metal collar, and
   the fixed fastening member is a metal-made member.

5. The electrical connection box according to claim 3,
   wherein the leg portion is provided with a first metal collar,
   the contact portion is provided with a second metal collar, and
   the fixed fastening member is a metal-made member.

6. An electrical connection box comprising:
   a connection box housing having an insulation property configured to store a connection box bus bar having conductivity inside the connection box housing; and
   a branch box housing having an insulation property configured to store a branch box bus bar having conductivity inside the branch box housing;
   wherein the branch box housing and the connection box housing are stacked in a vertical direction, and
   the branch box bus bar is electrically connected by jointly fastening one branch box bus bar tip portion and an electric wire terminal using an electric wire fastening member in a state in which the one branch box bus bar tip portion is in direct contact with the electric wire terminal and by jointly fastening the other branch box bus bar tip portion and a connection box bus bar tip portion of the connection box bus bar using the bus bar fastening member in a state in which the other branch box bus bar tip portion is in direct contact with the connection box bus bar tip portion of the connection box bus bar.

* * * * *